(12) United States Patent
Kopp et al.

(10) Patent No.: US 6,319,383 B1
(45) Date of Patent: Nov. 20, 2001

(54) DEVICE AND METHOD FOR EVENING OUT THE THICKNESS OF METAL LAYERS ON ELECTRICAL CONTACT POINTS ON ITEMS THAT ARE TO BE TREATED

(75) Inventors: Lorenz Kopp, Altdorf; Peter Langheinrich, Feucht; Reinhard Schneider, Cadolzburg, all of (DE)

(73) Assignee: Atotech Deutschland GmbH (DE)

(*) Notice: Subject to any disclaimer, the term of this patent is extended or adjusted under 35 U.S.C. 154(b) by 0 days.

(21) Appl. No.: 09/485,785

(22) PCT Filed: Aug. 19, 1998

(86) PCT No.: PCT/DE98/02503
§ 371 Date: Mar. 27, 2000
§ 102(e) Date: Mar. 27, 2000

(87) PCT Pub. No.: WO99/10568
PCT Pub. Date: Mar. 4, 1999

(30) Foreign Application Priority Data

Aug. 21, 1997 (DE) ............................................. 197 36 352

(51) Int. Cl.⁷ ............................. C25D 5/00; C25D 17/00
(52) U.S. Cl. ........................... 205/96; 205/137; 205/136; 204/205; 204/206
(58) Field of Search ............................. 205/96, 137, 122, 205/125, 127, 126, 152; 204/198, 202, 205, 230.2, 230.4, 297.01, 297.05, 206, 211, 204, 297.16, DIG. 7

(56) References Cited

U.S. PATENT DOCUMENTS

| | | |
|---|---|---|
| 4,385,967 | 5/1983 | Brady et al. . |
| 4,755,271 | 7/1988 | Hosten . |
| 4,776,939 | 10/1988 | Blasing et al. . |
| 4,879,007 | 11/1989 | Wong . |
| 5,391,276 | 2/1995 | Astor et al. . |
| 5,401,370 | 3/1995 | Kauper et al. . |
| 5,985,123 | * 11/1999 | Koon ...................................... 205/96 |
| 6,132,583 | * 10/2000 | Stone ..................................... 205/96 |

FOREIGN PATENT DOCUMENTS

| | | |
|---|---|---|
| 30 27 751 | 2/1982 | (DE) . |
| 32 36 545 | 5/1983 | (DE) . |
| 37 26 571 | 8/1987 | (DE) . |
| 36 24 481 | 1/1988 | (DE) . |
| 40 05 209 | 6/1991 | (DE) . |
| 41 06 733 | 9/1992 | (DE) . |
| 0 254 962 | 7/1987 | (EP) . |
| 0 578 699 | 4/1992 | (EP) . |

* cited by examiner

Primary Examiner—Robert Dawson
Assistant Examiner—Michael J Feely
(74) Attorney, Agent, or Firm—Paul & Paul

(57) ABSTRACT

The invention relates to a device and a method for evening out the thickness of metal layers on electrical contact points on flat items to be treated 7, such as conductor foil and printed circuit boards, during the electrolytic treatment of the items to be treated, guided in a horizontal plane of conveyance in a continuous electroplating plant. The device has counter-electrodes 2, 3 located opposite the plane of conveyance and clamps 4, secured to a continuously revolving means of conveyance 5, for contacting the items to be treated 7. The clamps 4 have a lower portion 14 and an upper portion 13 which are electrically conductive, have a surface consisting of metal, are moveable in relation to one another and respectively have at least one contact point 6 for the items to be treated 7. In addition, at least one current source is provided to produce a flow of current between the counter-electrodes and the items to be treated.

Figure 1A:
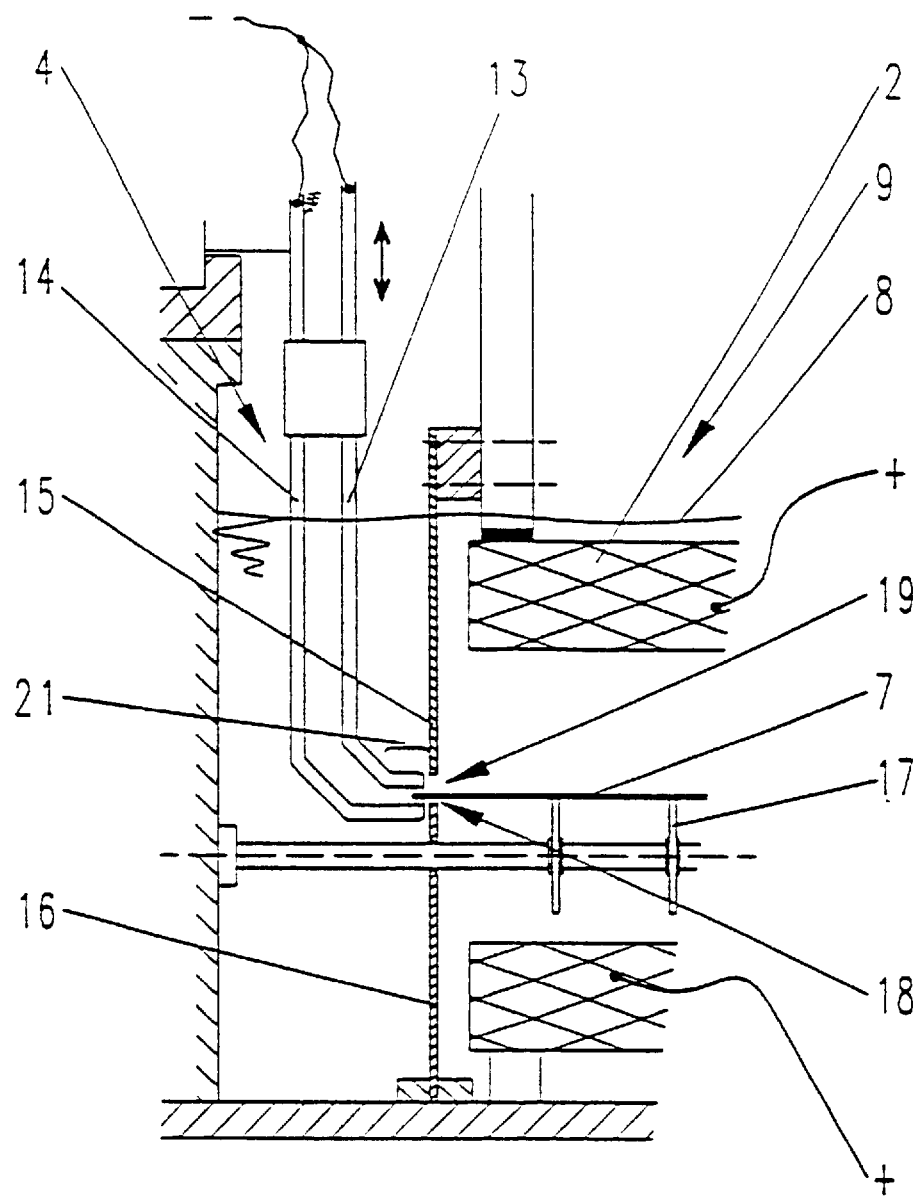

To avoid the pirate cathode effect of the contact clamps 4 during electrolytic metallisation, there are disposed between the anodes 2, 3 and the clamps 4 upper and lower shields 15, 16 for the electrical field, which extend so close to the plane of conveyance that the items to be treated, guided in the plane of conveyance, and the clamp portions 13, 14 do not quite come into contact with the shields.

14 Claims, 5 Drawing Sheets

DEVICE AND METHOD FOR EVENING OUT THE THICKNESS OF METAL LAYERS ON ELECTRICAL CONTACT POINTS ON ITEMS THAT ARE TO BE TREATED

DESCRIPTION

The invention relates to a device and a method for evening out the thickness of metal layers on electrical contact points on flat items to be treated, such as conductor foil and printed circuit boards, during electrolytic treatment, especially electrolytic metallisation, of the items guided in a horizontal plane of conveyance in a continuous electroplating plant. The device finds particular application in plants in which the items to be treated are guided in a horizontal position.

In electroplating plants for metal deposition, flat items to be treated are usually gripped at one side or at both sides at the edge by clips or clamps. The clips or clamps serve to convey the items to be treated through the plant and simultaneously to provide electrical contact, i.e. to supply the electroplating current to the items. The items to be treated are, for example, printed circuit boards, especially so-called multilayer circuits, with board thicknesses of up to 8 mm. It can happen that in a continuous electroplating plant both printed circuit boards with a thickness of that kind and toils with a thickness of only 0.1 mm or less are produced.

A further requirement of an electroplating plant consists in the required evenness and precision of the distribution of the thickness of the metal layer. The electrolytically deposited metal layers must, for technical and economic reasons, be very evenly thick right into the edge regions of the items to be treated. The edge regions, in which clear deviations from the pre-determined standard layer thickness occur, should be as narrow as possible. In precision conductor technology (conductor track widths and spacings of approximately 120 $\mu$m and less), for example, a relative layer thickness tolerance in the usable range of the items to be treated (outside the non-utilisable edge region) is required which is below 10%. Even in the proximity of the points on the items to be treated to which the clips or clamps are applied during electroplating, the required even distribution of the layer thickness cannot be achieved. Therefore, the regions in the vicinity of these contact points count as edge regions.

In DE 36 24 481 C2 is described a clamp which is used in a horizontal continuous electroplating plant. Many clamps of this kind are secured at a spacing from one another to a revolving conveyor belt. As they run into the electroplating plant, the items to be treated are grasped at their side edge by the clamps. For this purpose, two straps are swung towards one another and the edge of the items to be treated is held tight by the clamp with the aid of a pressure spring in the clamp. In another embodiment, displacing the straps perpendicular to one another is suggested in order to open the clamps. The contact pressure is in this case applied by a tension spring. At the exit from the electroplating plant the clamps are opened again by means of an oblique stop face. Thus the printed circuit boards are released again and are generally conveyed further by conveying rollers.

During the electroplating of items to be treated, the metallic straps of the clamps are also simultaneously metallised. These thus act as pirate cathodes in relation to the surface of the items to be treated which lies in the vicinity of the clamps. Because of the small layer thickness which occurs in this region, a correspondingly broad edge strip cannot be used. Experience has shown that this non-utilisable width is approximately 60 mm. In order to avoid the formation of fluctuations in layer thickness, in the publication mentioned it is recommended that the straps be provided with a plastics material cover. Only the ends which provide the contact to the items to be treated should, according to this document, remain metallically bare. In the publication is further stated that these points are deplated again electrolytically in a deplating chamber during the return travel of the clamps in the plant.

The plastics material cover makes it possible to operate the clamps within the electrolytic bath. Additional sealing walls to keep the electrolyte away from the clamps are therefore not necessary. This type of operation will be referred to below as wet contacting. The plastics material cover of the clamps consists, for example, of ECTFE (poly(ethylene trichlorofluoroethylene)). Manufacturing a plastics material coating with this chemically resistant plastics material is very involved and therefore expensive.

Mechanical damage to the plastics coating, caused by sharp-edged tools or printed circuit boards, can, however, also not be avoided when this or some other suitable plastics material is used. The service life of the clamps is therefore on average only twelve months.

During electroplating, the clamps are cathodically polarised. In practice it has been shown that the plastics material cover of many clamps is metallised after lengthy use. The undesired metallisation even takes place if the clamps are regularly electrolytically deplated during their return travel. However, the causes for this are not known. It is thought that the ageing of the plastics material cover in conjunction with the organic and/or inorganic electrolyte additives plays a role: the securely adhering metallic layer on the plastics cover begins, in the electrolyte, to grow from the metallically bare points of the clamps outwards, for example the bare contact points at the ends of the straps. In particular, however, these are damaged areas of the plastics material covers of the clamps which are caused by cleaning work during heavy duty, for example by incorrectly positioned and very sharp-edged printed circuit boards or by inappropriate treatment of the covers.

The following processes take place: through the partially very small open damaged areas, such as for example cracks in the plastics material covers, an electroplating process begins which produces a thin electrically conductive connection between the metal strap of the clamp and the metallic layer slowly growing on the outer side of the plastics material cover. During the return of the clamp in the continuous electroplating plant, the electroplated layer is intended to be electrolytically removed. The electrically conductive connection in a damaged area is removed first by preference and thus in a very short time. Thus the electrical connection of the metallic layer, which has grown on the plastics material cover, to the metal strap is lost even before this layer could be completely removed electrolytically. If the clamp is located again in the metallising region of the electroplating plant, the remaining metallisation becomes electrically conductive again through the damaged area, by new metal being electrolytically deposited inside the damaged area over the electrical connection to the metal strap. The metallisation therefore continues to grow. This repeated slow process leads, in a plant which is operated constantly, after weeks or months, to the clamps being unusable, since the undesired metallisation on the plastics material cover acts as a pirate cathode in relation to the metallisation on the items to be treated. The plastics material cover must therefore be renewed. This is connected with high costs. In addition, loss of production occurs.

In DE 32 36 545 C3 is described a device for electroplating individual plate-shaped work pieces which are guided in succession in a horizontally aligned direction by means of rotatable conveying devices through an electrolytic bath provided at its entrance and exit with seals, a plurality of cathodically switched contact wheels, located opposite one another in pairs and able to be pressed against one another, being provided as a conveying device in the bath and in particular also to provide electrical contact for the work pieces at one side of the conveyance path. Furthermore, in order to completely shield the contact wheels from the bath, they are provided with screens which have openings appropriately slit for the passage of the workpieces, wiping devices being provided along the slit openings of the screens and carried in front of the screens, which lie sliding on the workpieces, in order to restrict the contact of the contact wheels with the electrolytic fluid.

It has emerged that these contact wheels are not suitable for the electrolytic deposition of metal on items to be treated, since it is not possible to avoid metal being deposited on the front faces of the wheels. Through the metal deposition, the diameter of said wheels becomes gradually larger, and in particular the front faces of the wheels become rough and therefore damage the surfaces of the items to be treated. In order to remove metal from the wheels, the latter have to be sporadically dismantled and have metal removed from them. For this purpose, the whole plant has to be shut down. This leads not only to lower productivity of the plant but also to other consequential damage, for example production of waste in the following start-up phase when the plant is started up again, since the metallisation baths generally have to be run in first until the deposition conditions in the bath have stabilised again.

In EP 0 254 962 A1 are described contact terminals which are provided for dry contacting. To this end, the contact terminals are shielded from the ingress of the electrolyte solution by means of a seal lying against the items to be treated. Nevertheless, in this publication it is mentioned that the remaining regions of the contact terminals, which do not serve to provide contact, are coated with plastics material to protect them against undesired metal deposition. Undesired deposits on the contact terminals are removed by chemical and/or mechanical cleaning during the return travel of the terminals. Sealing of the cathode terminals, by a seal lying under spring pressure against the items to be treated, leads to disadvantages, because printed circuit boards are always sharp-edged. Holes in the edge region of the printed circuit boards, which are necessary for positioning or coding of the boards, for example, also have sharp edges. The seals therefore wear quickly. The parts of the seals thus rubbed away inevitably reach the electrolyte and are consequently integrated into the electroplating layer on the printed circuit board surface. Items of this type are waste. In addition there is the danger that conductor foils are wrinkled and/or warped by the seal lying in close contact. On the other hand, with thicker boards, complete sealing is not possible, because in the gap between two successive printed circuit boards, electrolyte reaches the contact terminals and other constructional elements of the plant. Uncontrolled metallisation of cathodically polarised parts and corrosion of conveying members by the electrolyte can consequently not be avoided.

The problem underlying the invention, therefore, is to avoid the disadvantages of the known devices and methods and in particular to quote a device with which low-cost production is possible and which renders possible largely maintenance-free constant operation. Above all, even distribution of the layer thickness on the items to be treated and in the holes of same, both on thick printed circuit boards and on thin conductor foil, is intended to be able to be maintained, which can also be achieved in the edge region of the items to be treated, without re-equipping the plant.

The problem is solved by the device according to claim 1 and the method according to claim 11.

The device and the method according to the invention serve to even out the thickness of metal layers on electrical contact points during the electrolytic treatment of items to be treated. The device contains counter-electrodes located opposite the plane of conveyance and clamps for contacting the items to be treated, said clamps being secured to a continuously revolving means of conveyance. The clamps each have a lower portion and an upper portion, which are electrically conductive, have a surface consisting of metal, may be moved in relation to one another and respectively have at least one contact point for the items to be treated. In addition, at least one current source is provided to produce a flow of current between the counter-electrodes and the clamps. Between the counter-electrodes and the clamps are disposed upper and lower shields for the electrical field, which extend so close to the plane of conveyance that the items to be treated, guided in the plane of conveyance, and the clamp portions do not quite come into contact with the shields.

The device and the method are used in particular during the electrolytic treatment of printed circuit boards and conductor foil, which are guided in a horizontal plane of conveyance in a continuous electroplating plant and thereby treated.

Evening out the thickness of the metal layers takes place particularly during the electrolytic metallisation (electroplating) of the goods to be treated. The device and the method may, however, also be used during electrolytic deplating or during electrolytic etching of metal layers. The following explanations admittedly relate exclusively to the electrolytic metallisation of the items to be treated; however the remarks apply analogously to deplating or etching of the metal layer on the items to be treated. In particular, the counter-electrodes are switched in this case as cathodes and the items to be treated as the anode, whilst in the case of the electroplating of the items to be treated, the counter-electrodes are switched as anodes and the items to be treated as the cathode. In corresponding manner, the counter-electrodes and the items to be treated can also be connected to a pulse current source or a pulse voltage source, for example to generate monopolar or bipolar pulse currents between the counter-electrodes and the items to be treated. In this case, the counter-electrodes are polarised briefly in succession anodically and cathodically and the items to be treated are polarised conversely.

In contrast to prior art, in the device according to the invention the plastics material cover of the clamp portions is completely dispensed with, although the clamps are continuously in contact with electrolyte solution (wet contacting). To avoid any too great a pirate cathode effect through the clamps, both clamp portions are shielded against the anodes (counter-electrodes) which can be realised both soluble and insoluble. One of the shields is located in the space between the lower anodes of the electroplating plant and the clamp lower portions. The other shield is located in the space between the upper anodes and the clamp upper portions.

Preferred embodiments of the invention are quoted in the subordinate claims.

The shields are preferably configured substantially flat and aligned substantially perpendicular to the plane of conveyance and parallel to the direction of conveyance of the items to be treated in the electroplating plant.

The shields consist preferably of an electrically non-conductive material, such as for example plastics material or ceramics. They can, however, also consist of electrically conductive material which is provided at its surface with an insulating coating or with an anodic passivation layer, for example made of insulation-coated metal or of a metal which is anodically passivated at the surface, such as titanium for example.

In order to avoid any possible inter-conductor electroplating, the metal can be connected to the respective upper or lower anode potential. For this purpose, electrically conductive connections between the shields, consisting of electrically conductive material, and the anodes are provided. This electrically conductive connection between the shields and the anodes can have an electric resistance for safety reasons. For example, a resistor which limits short-circuit current can be inserted.

The shields extend along the whole path of conveyance in the electroplating region of the continuously operating plant. In order to avoid a short-circuit, electrically conductive shields are so secured that the clamps and the items to be treated do not touch in the uninterrupted constant operation. Shields formed from an insulator are also, in order to avoid any gradual electroplating which experience has shown is possible, so adjusted that they come into contact neither with the surface of the items to be treated nor with the clamp portions.

For the above-mentioned reasons, the shields are not completely sealed against electrolyte solution flowing through. Therefore, the bare clamp portions in the region of the clamp gripping point, i.e. in the region of the items to be treated, also become slightly electroplated. The influence of this metal deposition on the distribution of the layer thickness of the printed circuit boards in the region of the clamp gripping points is small however. This means in practice that only a very narrow edge strip of the printed circuit boards is still technically unusable. It is important for the reproducibility of precise electroplating results in continuously operating plants, that in the region of the gripping points, slightly metallised clamps are completely electrolytically deplated and cleaned during each return movement. Since the clamps are not provided with a plastics material coating, each metal deposition on the clamps has an ideal electrically conductive connection to the deplating current source.

A temporary break in this connection, as occurs with clamp portions covered with plastics material and therefore leads to deposits on these portions until they are unusable, cannot occur here. At the entry to the continuous electroplating plant, therefore, there is always available a completely electrolytically etched, i.e. cleaned, clamp.

Dispensing completely with a plastics material cover for the clamp portions is, furthermore, also advantageous in relation to costs and to the service life of the clamps. The bare clamp may be manufactured cost-effectively and the service life is practically unlimited.

The lower half of the clamp is located with its contact point always at the constant level of the lower sides of the printed circuit boards guided in the plane of conveyance. For this reason, the lower shield can be led very exactly to the lower side of the printed circuit board. With a realisable spacing of the shield from the lower side of the printed circuit boards and from the clamp lower portion of approximately respectively 1mm, almost complete shielding of the electrical field at the location of the clamp lower portion can be realised.

Different thicknesses of printed circuit board are compensated for by the clamp upper portions being designed so as to be displaceable. The upper shield must therefore be disposed so far removed from the upper side of the printed circuit boards that, with the thickest printed circuit boards to be conveyed, there is still a safety spacing between the upper side of the printed circuit boards and the shield of approximately 1 mm also. This means that with a maximum printed circuit board thickness of 8 mm, the spacing of the upper shield from the zero level (level of the lower side of the printed circuit boards) must be 9 mm. On account of this relatively large spacing, during processing of foil having a thickness of, for example, 0.1 mm, metal is deposited on the clamp upper portions to a significant extent. As a result of the greater pirate cathode effect of the clamp upper portion, connected therewith, a correspondingly larger edge region of the conductor foil cannot be used. With increasing thickness of the printed circuit boards, the non-utilisable edge region of the printed circuit boards increases as a result of the increasing shielding. if, in an electroplating plant, conductor foil or printed circuit boards with only small differences in thickness or of only a single thickness are produced, the upper shield can be adjusted very exactly to the thickness of the items to be treated. In practice, this case of mono-production occurs predominantly. The non-utilisable edge region of the items to be treated is in this case minimal.

If, on the other hand, in an electroplating plant, alternately foil, printed circuit boards and multilayer circuits up to a thickness of, for example, 8 mm are produced, and if simultaneously the usable region of the foil and boards is to be extended up to the maximum possible limit, each metallically bare clamp upper portion is equipped with a screen which travels with it and is secured to the upper portion of the clamp. The screen is aligned substantially parallel to the clamp upper portion and extends so close to the plane of conveyance, in which the printed circuit boards or conductor foil are guided, that the screens do not quite come into contact with the items to be treated, guided in the plane of conveyance, and the contact point.

The screen consists of an electrically non-conductive material, such as, for example, ceramics or plastics material. It is secured to the clamp upper portion at a largish spacing from the clamp contact point. At the securing point there is practically no electrical field as a result of the upper shield. Thus deposition of a metal layer on the plastics material is impossible. The screen extends in cantilever manner from the securing point down to the contact point. By being secured to the clamp upper portion, it carries out with the latter all the opening and closing movements of the clamp upper portion. The spacing between the screen and the upper side of the items to be treated is set in the same way as that between the lower shield and the lower side of the items to be treated. The screen therefore does not come into contact with the surface of the items to be treated nor with the contact point of the clamp.

The width of the screens (measurement of the screens viewed in the conveying direction of the items to be treated in the electroplating plant) corresponds approximately to the spacing between one clamp and an adjacent clamp. To improve the seal, the screens of adjacent clamps can also overlap one another. Furthermore, between the screens and the upper anode baskets is disposed the described static shield with the spacing offered to avoid collision. With the additional screens, the technically non-utilisable edge strip of items to be treated is reduced in the clamp region to 12 mm. This strip width is independent of the thickness of the items and always the same size.

In addition, there can be attached to the screens or to the upper shields, additional upper screens, aligned substantially horizontally, and to the lower shields, lower screens aligned substantially horizontally. These serve to even out the distribution of layer thickness in the edge region of the items to be treated, since the lines of electrical flux concentrate basically in the edge regions of electrically conductive objects and lead there to greater metal layer thicknesses. To have a further advantageous influence on the distribution of the metal layer thickness on the items to be treated, openings are also provided in the horizontally aligned screens.

By preference, the contact points on the upper and lower clamp portions, for electrically contacting the items to be treated, are disposed at the outermost ends of the clamp portions.

The invention is explained in greater detail below with the aid of FIGS. 1 to 5.

Figure 1B:
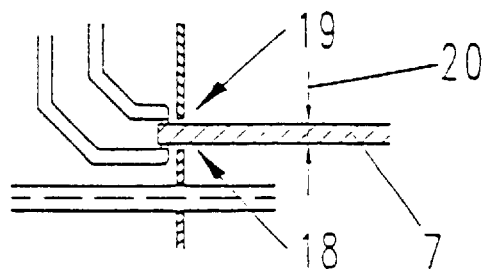
Figure 2A:
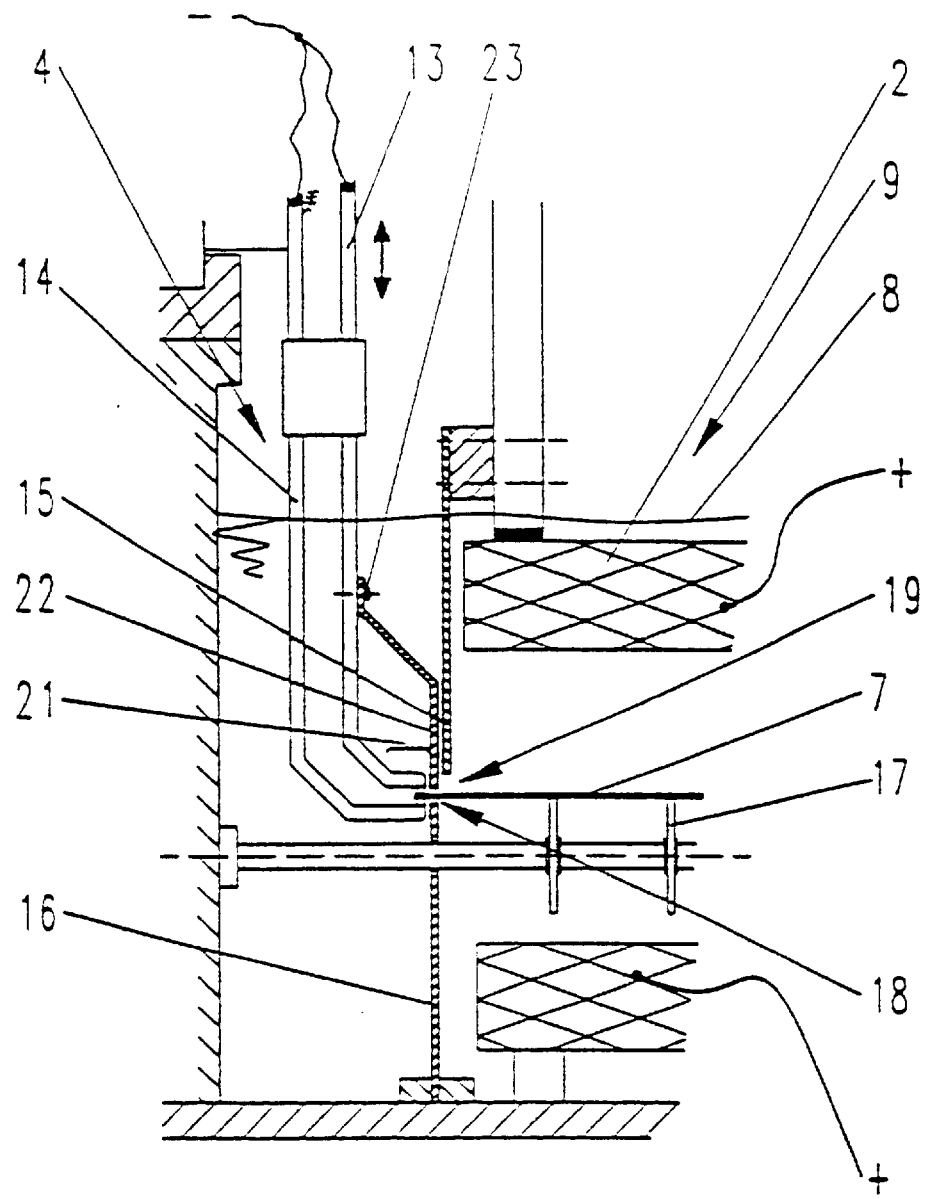
Figure 2B:
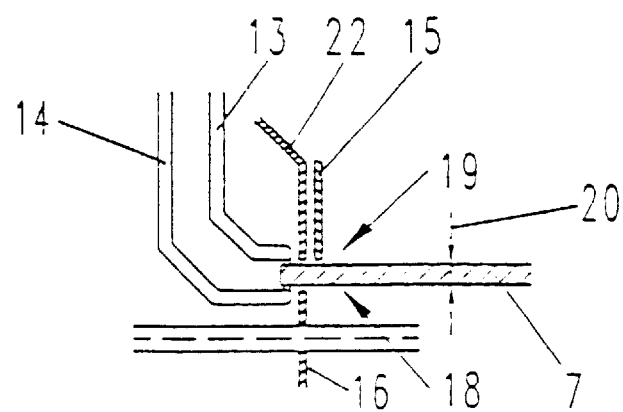
Figure 3:
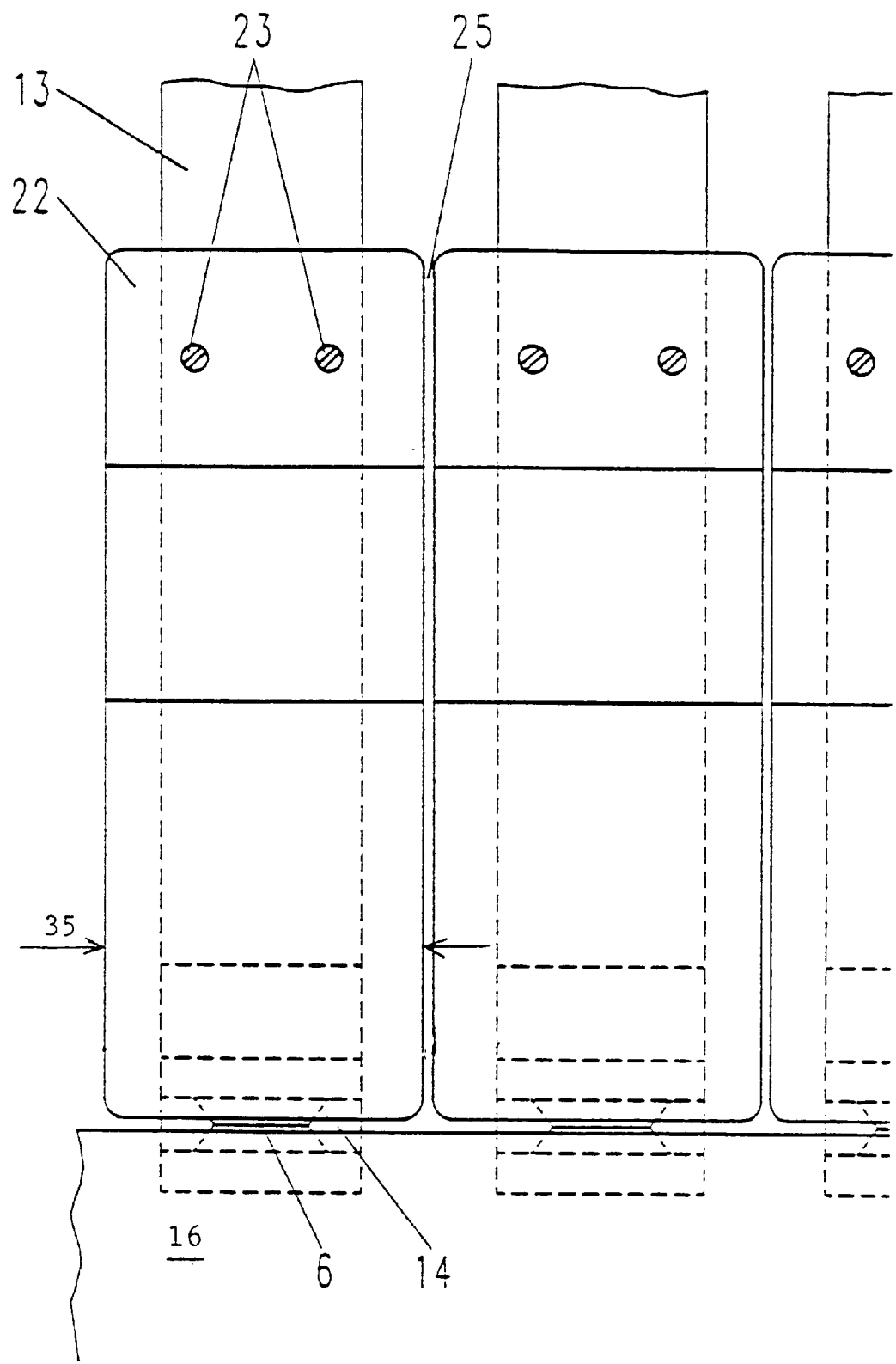
Figure 4:
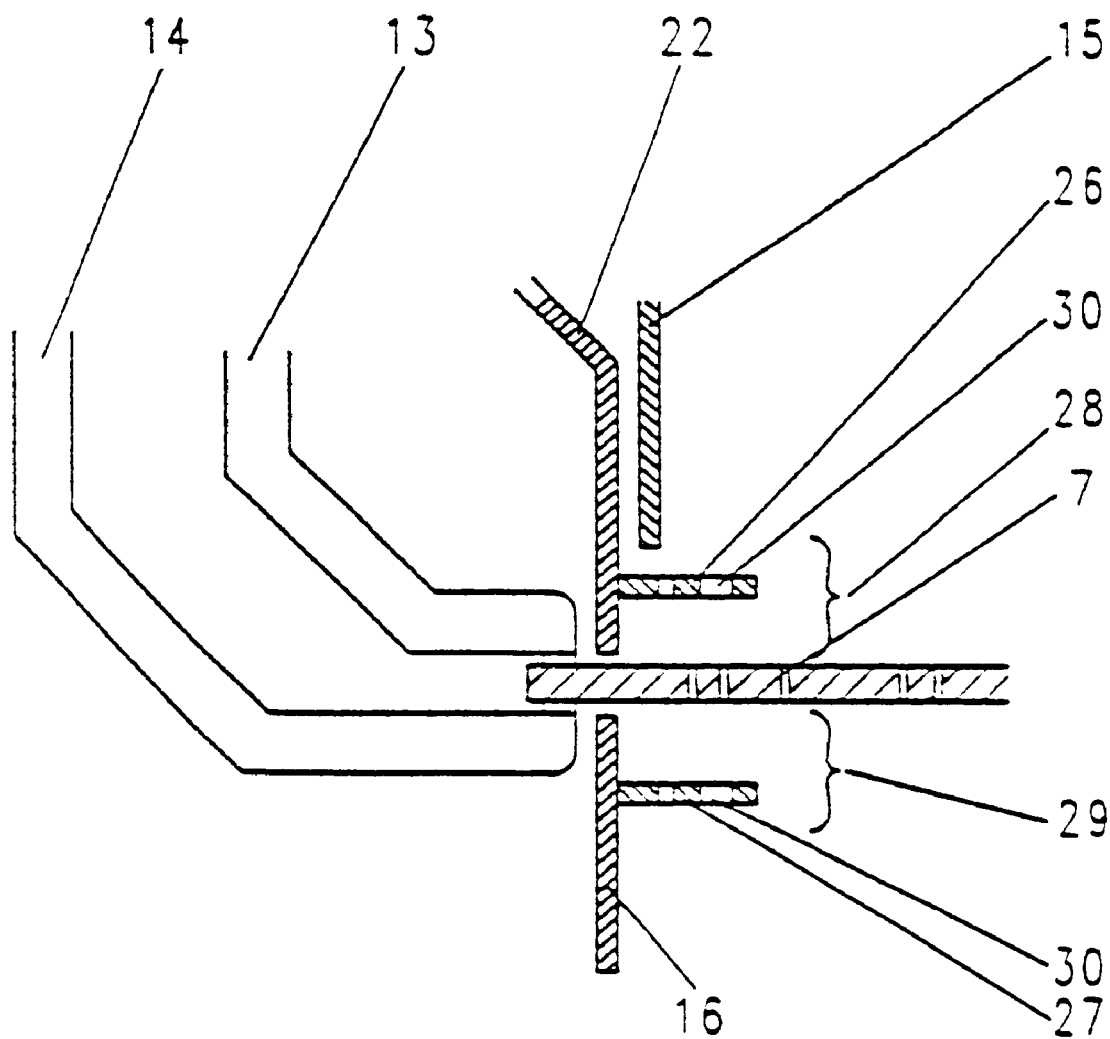
Figure 5:
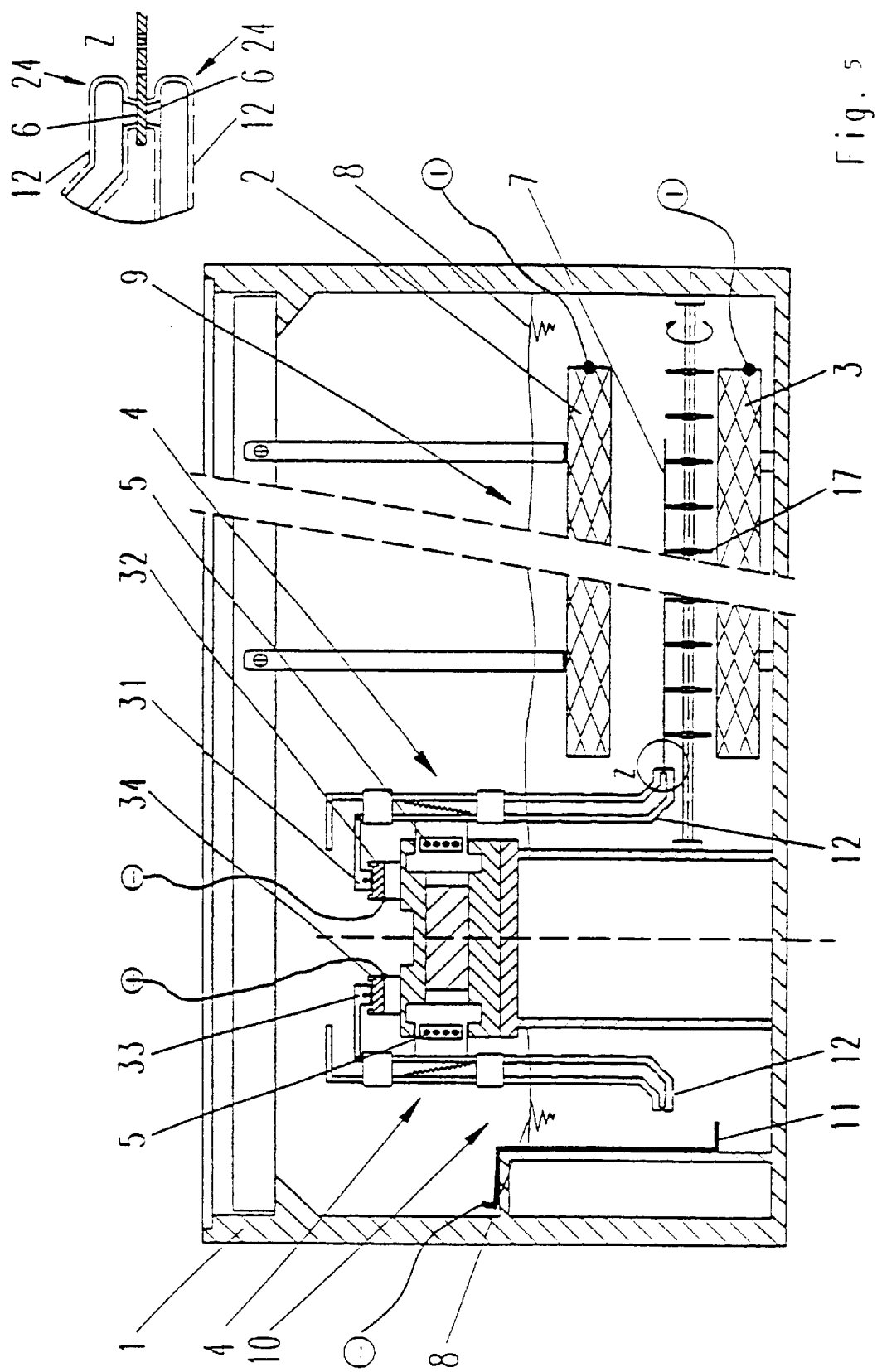

These show:

FIG. 1a: a detail of a schematic cross-sectional representation through a horizontal continuously operating electroplating plant, viewed in the direction of conveyance, with shields and with a clamp gripping a foil;

FIG. 1b: a cross-sectional view of a clamp gripping a thick printed circuit board;

FIG. 2a: a view as in FIG. 1a of the plant with a clamp having an additional screen;

FIG. 2b: a view as in FIG. 1b of the plant with a clamp having an additional screen;

FIG. 3: a front elevation of screens secured to the clamp upper portion;

FIG. 4: a view as in FIG. 1b of the plant with a clamp having additional horizontal screens;

FIG. 5: a schematic cross-section through the upper region of a horizontal continuous electroplating plant according to prior art.

A conventional electroplating plant is represented in FIG. 5. In the work container 1 are located upper anode baskets 2 and lower anode baskets 3. A real 6 meter long continuous electroplating plant comprises, for example, twenty-five upper and twenty-five lower anode baskets. These are disposed the one behind the other in the direction of conveyance of the items to be treated, for example printed circuit boards. In the view in FIG. 1, seen in the direction of conveyance, only one upper and one lower anode basket can therefore be recognised. Similarly, the clamps 4 in the figure lie behind one another. The spacing from clamp to clamp is, for example, 60 mm. The clamps 4 are secured to a motor-driven continuously revolving conveyor belt 5. The clamps 4 grasp the items to be treated 7 at the clamp contact point 6 (detail Z). They guide and transport the items through the electroplating plant. The work container 1 is filled with electrolyte. The bath liquid level 8 lies above the upper anode baskets 2. In the right-hand portion of FIG. 1 is located the electroplating region 9 and in the left-hand portion the deplating region 10. There is the same electrolyte fluid in both regions. The anodes, here in the form of baskets 2, 3, are filled with soluble anode metal. The anodes 2, 3 and the items to be treated 7 together form the electroplating cells. The clamps 4 and the cathodes 11 in the deplating region together form the deplating cell. The potentials of all the electrodes are given additionally in FIG. 5. Via sliding contacts 31, the metallisation cathode potential is applied via slide rail 32 to the clamps 4 and from there to the items to be treated 7. Via additional sliding contacts 33, the deplating anode potential is applied to the clamps 4 which are to be deplated in the deplating region 9.

The clamps 4 are coated up to far above the liquid level of the bath 8 with a plastics material cover 12 (detail Z). Only the clamp contact points 6 are metallically bare. These are electroplated in the electroplating region 9 just like the items to be treated 7. Furthermore, the clamp plastics material cover is electroplated, as described above. In the deplating region 10, the clamp contact points 6 are deplated again. The metal layer on the plastics material cover is, on the other hand, only partially removed again by deplating. After a longish operating time this leads to these known clamps being unusable.

The arrangement according to the invention, represented in FIGS. 1a and 1b, serves to avoid this breakdown. The clamps 4 consist of metallically bare material, for example of titanium. The plastics material cover is thus dispensed with. The clamps grasp the items to be treated 7 and guide them through the electroplating region 9 of the continuous electroplating plant. To avoid the clamp upper portions 13 and lower portions 14 being electroplated, an upper shield 15 is inserted between the upper anode basket 2 and the clamp 4. In a corresponding manner, below the items to be treated a lower shield 16 is inserted into the electrical field leading from the lower anode basket to the clamp lower portion 14. The shields 15, 16 extend along the whole path of conveyance in the electroplating region 9 of the electroplating plant.

The lower shield 16 extends to close to the surface of the items to be treated. The level of the lower side of the items to be treated is predetermined by the driven supporting rollers 17 and is thus constant. Thus the safety spacing 18 between the upper end of the shield 16 and the lower surface of the items to be treated can also be kept constant and small. The axle of the supporting rollers 17 is guided through a hole in the lower shield 16. The axle can also be mounted in this shield. The upper spacing 19 between the lower end of the shield 15 and the upper surface of the items to be treated must be selected so large that, as a safety spacing on the items to be produced having the greatest thickness 20, a value can still be maintained which corresponds to the lower spacing 18. This situation is represented in detail in FIG. 1b.

The lines of electric flux of the electrical field of the upper anode engage through the gap 19 between the lower end of the upper shield 15 and the items 7 to be treated and reach the lower region of the clamp 4, if a greater spacing arises there as a result of processing thin foil. The result of this is distance-determined electroplating of a region 21 on the metallically bare clamp. To avoid this electroplating, the screen 22, represented in FIGS. 2a and 2b, is secured to the clamp upper portion 13.

The screen 22 consists of an electrically non-conductive material. it does not come into contact with the clamp in its lower region. This prevents the plastics material of the screen from being possibly electroplated, as described above. The securing point 23 on the clamp upper portion 13 should be so positioned that the electrolyte distance from that point to the upper anode basket 2 is as long as possible, in order permanently to avoid metallisation of the screen 22. The securing point 23 can lie below or above the liquid level of the bath. If it is below the liquid level of the bath, the field lines which proceed from the anode are kept away from the securing point 23 by the upper shield 15. This reliably prevents the possible spreading of an electroplating layer from the metallically bare clamp upper portion 13 onto the screen 22 even if the securing point, and thus the screen, is located below the liquid level of the bath 8.

By the screen, as a result of being attached to the clamp upper portion, always moving with the movement of the latter, automatically there is always a minimum safety spacing set between the screen and the items to be treated, which is just as small as the spacing 18 on the lower side. Thus very even distribution of the layer thickness is achieved on both sides of the items to be treated, right into the edge region.

Furthermore, by the clamps being metallically bare and not provided with a plastics material insulation, a more advantageous design of the clamp contact points arises. The insulated projections 24, recognisable in FIG. 5, beyond the clamp contact points 6 are here dispensed with completely. In the embodiment according to the invention, the clamp contact points lie at the outer end of the clamp portions (in the direction towards the utilisable region of the items to be treated 7) such that the shielding effect of the clamps on the items to be treated is further minimized. The non-utilisable edge of the clamp particularly attains a minimum if simultaneously the shields 15, 16 and the screen 22 in the vicinity of the items to be treated are also configured very thin. Particularly suitable for this is the realisation of the shield from a passivated or coated metal.

In FIG. 3 are represented clamps with attached screens 22, in front elevation and without items to be treated, for example printed circuit boards. The view represents a detail of the plant in side view, i.e. the direction of conveyance for the items to be treated runs in this figure from left to right or from right to left. Since no items to be treated are represented, the clamp upper portions and the clamp lower portions come into contact with one another at the contact points. The screens have a width 35. The lower clamp contact point 6 is shielded by the lower stationary shield 16. Between two screens 22 on adjacent clamps is formed a screen gap 25. This should be as small as possible in order to avoid electroplating the clamp. In an embodiment not shown, the screens 22 can also overlap one another. The gap is thus closed. The distribution of layer thickness of the items to be treated is intended to maintain a predetermined tolerance except for a narrow edge region of the items to be treated. It is known that a concentration of field lines occurs in the edge region of the items to be treated. The metallically bare clamp represents, through the safety spacings between the shields or the screen and the surfaces of the items to be treated, only a very weakly acting pirate cathode. The consequence of this is a rise in layer thickness on the items to be treated in the vicinity of the screen 22 and of the shields 15, 16.

This rise is countered by screens which are inserted horizontally in the affected edge region of the items to be treated between the latter and the anodes. Screens which are disposed close to the surface of the items are particularly effective. In FIG. 4 are represented horizontal screens 26, 27 of this type. They are secured at the top to screen 22 and at the bottom to shield 16. The screen 22 is secured to the vertically moveable clamp upper portion 13. Thus the upper gap, via which lines of electric flux can penetrate into the space behind shield 15 and the screens 22, 26, is kept small and, in particular, constant. Thus the spacing 28 between the horizontal screen 26 and the upper side of the items to be treated is also constant. The same is true of the gap between shield 16 or screen 27, since the lower spacing between the upper edge of the lower shield 16 and the lower side of the items to be treated is constant anyway, such that the securely mounted horizontal screens 27 are at a constant spacing 29 from the lower side of the items to be treated.

The lower screen 27 can be mounted continuously in the direction of conveyance. At the top, the length of the co-travelling screens 22 corresponds to the clamp spacing plus a possible overlap of the screens. The screens 26, 27 are preferably provided with openings 30. By means of these openings, the distributions of layer thicknesses on the surfaces of the items to be treated 7 are so influenced that the metal layer thicknesses run evenly up to the screen 22 or to the shield 16. In electroplating plants having clamps without screens 22, the upper horizontal screen 26 can also be secured to the upper shield 15.

All the disclosed features and combinations of the disclosed features are the subject matter of this invention, insofar as these are not expressly referred to as known.

List of Reference Numerals
1 work container
2 upper anode basket
3 lower anode basket
4 clamp
5 continuous conveyor belt
6 clamp contact point
7 items to be treated
8 bath liquid level
9 electroplating region
10 deplating region
11 deplating cathode
12 plastics material cover
13 clamp upper portion
14 clamp lower portion
15 upper shield
16 lower shield
17 supporting rollers
18 lower spacing (=safety spacing)
19 upper spacing
20 thickness of items to be treated
21 region of clamp electroplating
22 screen
23 securing point
24 insulated projection
25 screen gap
26 upper horizontal screen
27 lower horizontal screen
28 upper screen spacing
29 lower screen spacing
30 openings
31 cathodic sliding contact
32 cathodic slide rail
33 anodic sliding contact
34 anodic slide rail
35 width of the screens 22

What is claimed is:

1. Device for evening out the thickness of metal layers on electrical contact points on flat items to be treated during electrolytic treatment of the items to be treated, led in a horizontal plane of conveyance in a continuous electroplating plant, which device has
   a) counter-electrodes located opposite the plane of conveyance,
   b) clamps secured to a continuously circulating means of conveyance, for contacting the items to be treated, the clamps having repsectively a lower portion and an upper portion,
      i. which are electrically conductive,
      ii. have a surface comprised of metal,
      iii. may be moved in relation one another and
      iv. respectively have at least one contact point for the items to be treated, and
   c) at least one current source to produce a flow of current between the counter electrodes and the clamps,
   characterized in that, between the counter-electrodes (2,3) and the clamps (4) are disposed upper and lower shields (15,16) for the electrical field, the shields being arranged with respect to the upper and lower clamp portion, respectively, in such a manner that electroplating of these clamp portions is avoided, the shields further extending so close to the plane of conveyance that the items to be treated, guided in the plane of conveyance, and the clamp portions (13, 14) do not quite come into contact with the shields.

2. Device according to claim 1, characterised in that the shields (15, 16) are configured substantially flat and are aligned substantially perpendicular to the plane of conveyance and parallel to the direction of conveyance of the items to be treated in the electroplating plant.

3. Device according to claims 1 or 2, characterised in that the shield (15, 16) is comprised of an electrically conductive material which is provided at the surface with an insulating coating or with an anodic passivation layer, or in that the shields (15, 16) consist of an electrically non-conductive material.

4. Device according to claim 3, characterised in that electrically conductive connections are provided between the shields (15, 16), consisting of electrically conductive material, and the counter-electrodes (2, 3).

5. Device according to claim 4, characterised in that the electrically conductive connections between the shields (15, 16) and the counter-electrodes (2, 3) have an electric resistance.

6. Device according to claims 1 or 2 characterized in that there are secured to the clamp upper portions (13), screens (22) which are aligned substantially parallel to the clamp upper portion and which extend so close to the plane of conveyance and to the contact point (6) that the screens do not quite come into contact with the items to be treated, guided in the plane of conveyance, and the contact point.

7. Device according to claim 6, characterised in that the screens (22), viewed in the direction of conveyance of the items to be treated in the electroplating plant, have a width which corresponds to the mutual spacing of the clamps, or are so wide that adjacent screens overlap one another.

8. Device according to claim 6, characterized in that there are secured to the screens (22) or to the upper shield (15) additional upper screens (26), aligned substantially horizontally, and, to the lower shields (16), lower screens (27), aligned substantially horizontally.

9. Device according to claim 8, characterised in that, to influence the distribution of the metal layer thickness on the items to be treated, openings (30) are provided in the horizontally aligned screens (26, 27).

10. Device according to claims 1 or 2, characterized in that the contact points (6) for providing electrical contact to the items to be treated are disposed on the outermost ends of the clamp portions (13, 14).

11. Method for evening out the thickness of metal layers on electrical contact points on flat items to be treated, during electrolytic treatment of items guided in a horizontal plane of conveyance in a continuous electroplating plant, which device has a) counter-electrodes located opposite the plane of conveyance,
b) clamps for contacting the items to be treated, secured to a continuously revolving means of conveyance and having respectively a lower portion and an upper portion,
  i. being electrically conductive,
  ii. having a surface comprised of metal,
  iii. being movable in relation to one another and
  iv. having respectively at least one contact point for the items to be treated, and
c) at least one current source to produce a flow of current between the counterelectrodes and the clamps, characterized in that, between the counter-electrodes (2,3) and the clamps (4) are disposed upper and lower shields (15, 16) for the electrical field, the shields being arranged with respect to the upper and lower clamp portion, respectively, in such a manner that electroplating of these clamp portions is avoided, the shields further extending so close to the plane of conveyance that the items to be treated, guided in the plane of conveyance, and the clamp portions (13, 14) do not quite come into contact with the shields.

12. Method according to claim 11, characterised in that the thickness of the metal layers is evened out during the electrolytic metallisation of the items to be treated, and in that the counter-electrodes are switched as anodes and the items to be treated as the cathode.

13. Device for evening out the thickness of metal layers on electrical contact points on flat items to be treated, during electrolytic treatment of the items to be treated, led in a horizontal plane of conveyance in a continuous electroplating plant, which device has a) counter-electrodes located opposite the plane of conveyance,
b) clamps secured to a continuously circulating means of conveyance, for contacting the items to be treated, the clamps having repsectively a lower portion and an upper portion,
  i. which are electrically conductive,
  ii. have a surface comprised of metal,
  iii. may be moved in relation one another and
  iv. respectively have at least one contact point for the items to be treated, and
c) at least one current source to produce a flow of current between the counterelectrodes and the clamps, characterized in that, between the counter-electrodes (2,3) and the clamps (4) are disposed screens (22) for the electrical field, which do not contact the lower portion of the clamps, and which extend so close to the plane of conveyance that the items to be treated, guided in the plane of conveyance do not quite come into contact with the screens.

14. Method for evening out the thickness of metal layers on electrical contact points on flat items to be treated, during electrolytic treatment of items guided in a horizontal plane of conveyance in a continuous electroplating plant, which device has a) counter-electrodes located opposite the plane of conveyance,
b) clamps for contacting the items to be treated, secured to a continuously revolving means of conveyance and having respectively a lower portion and an upper portion,
  i. being electrically conductive,
  ii. having a surface comprised of metal,
  iii. being movable in relation to one another and
  iv. having respectively at least one contact point for the items to be treated, and
c) at least one current source to produce a flow of current between the counterelectrodes and the clamps, characterized in that, between the counter-electrodes (2,3) and the clamps (4) are disposed screens (22) for the electrical field, which do not contact the lower portion of the clamps, and which extend so close to the plane of conveyance that the items to be treated, guided in the plane of conveyance do not quite come into contact with the screens.

* * * * *

UNITED STATES PATENT AND TRADEMARK OFFICE
CERTIFICATE OF CORRECTION

PATENT NO. : 6,319,383 B1
DATED : November 20, 2001
INVENTOR(S) : Kopp et al.

It is certified that error appears in the above-identified patent and that said Letters Patent is hereby corrected as shown below:

<u>Column 1,</u>
Line 21, please delete "toils" and replace with -- foils --.

Signed and Sealed this

Ninth Day of April, 2002

Attest:

Attesting Officer

JAMES E. ROGAN
*Director of the United States Patent and Trademark Office*